(12) United States Patent
Mitsunaga et al.

(10) Patent No.: US 8,698,202 B2
(45) Date of Patent: Apr. 15, 2014

(54) SEMICONDUCTOR DEVICE

(75) Inventors: Masahiro Mitsunaga, Kagoshima (JP); Shinichi Tamari, Kagoshima (JP); Yuji Ibusuki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/278,798

(22) Filed: Oct. 21, 2011

(65) Prior Publication Data
US 2012/0126291 A1 May 24, 2012

(30) Foreign Application Priority Data

Oct. 28, 2010 (JP) .................................. 2010-242639

(51) Int. Cl.
*H01L 29/66* (2006.01)
(52) U.S. Cl.
USPC .................... 257/195; 257/192; 257/E21.403
(58) Field of Classification Search
USPC ................. 257/206, 274, 338, 351, 357, 369, 257/E27.062, E27.064, E21.611, E21.632, 257/194, 192, 195, E29.315, E29.316, 257/E21.403; 438/172, 188
See application file for complete search history.

(56) References Cited

U.S. PATENT DOCUMENTS

| 5,479,033 | A | * | 12/1995 | Baca et al. | 257/192 |
| 6,153,897 | A | * | 11/2000 | Oguri et al. | 257/194 |
| 6,365,925 | B2 | | 4/2002 | Hase et al. | |
| 2001/0013604 | A1 | * | 8/2001 | Hase | 257/12 |
| 2004/0016965 | A1 | * | 1/2004 | Ui et al. | 257/335 |
| 2007/0138517 | A1 | * | 6/2007 | Nomoto | 257/288 |

FOREIGN PATENT DOCUMENTS

JP 11-150264 6/1999

* cited by examiner

*Primary Examiner* — Daniel Luke
*Assistant Examiner* — Khaja Ahmad
(74) *Attorney, Agent, or Firm* — Dentons US LLP

(57) ABSTRACT

A semiconductor device including at least a p-channel field-effect transistor region formed above a compound semiconductor substrate. The p-channel field-effect transistor region includes an undoped buffer layer; a p-type channel layer formed in contact with the buffer layer; a p-type source region and a p-type drain region formed in the channel layer, being separated with each other; and an n-type gate region formed above the channel layer and between the source region and the drain region. The buffer layer is formed having either a multilayer structure including a hole diffusion control layer with a band gap larger than the channel layer, or a single layer structure including only the hole diffusion control layer.

7 Claims, 18 Drawing Sheets

FIG. 3

| | CHANNEL 16 | SECOND BUFFER LAYER 15B | FIRST BUFFER LAYER 15A |
|---|---|---|---|
| 1 | GaAs | AlGaAs | GaAs, InGaAs |
| 2 | GaAs | InGaP | GaAs, InGaAs, AlGaAs |
| 3 | GaAs | InGaAsP | GaAs, InGaAs, AlGaAs |
| 4 | InGaAs | GaAs | InGaAs |
| 5 | InGaAs | AlGaAs | GaAs, InGaAs |
| 6 | InGaAs | InGaP | GaAs, InGaAs, AlGaAs |
| 7 | InGaAs | InGaAsP | GaAs, InGaAs, AlGaAs |
| 8 | AlGaAs | InGaP | GaAs, InGaAs, AlGaAs |
| 9 | AlGaAs | InGaAsP | GaAs, InGaAs, AlGaAs |

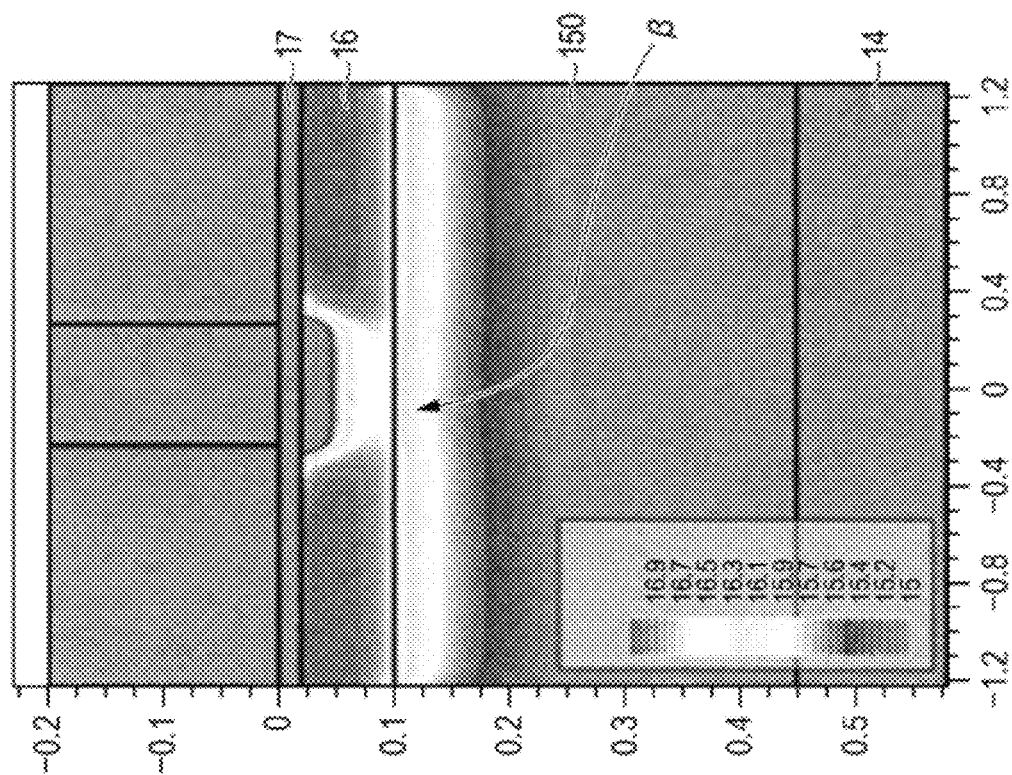
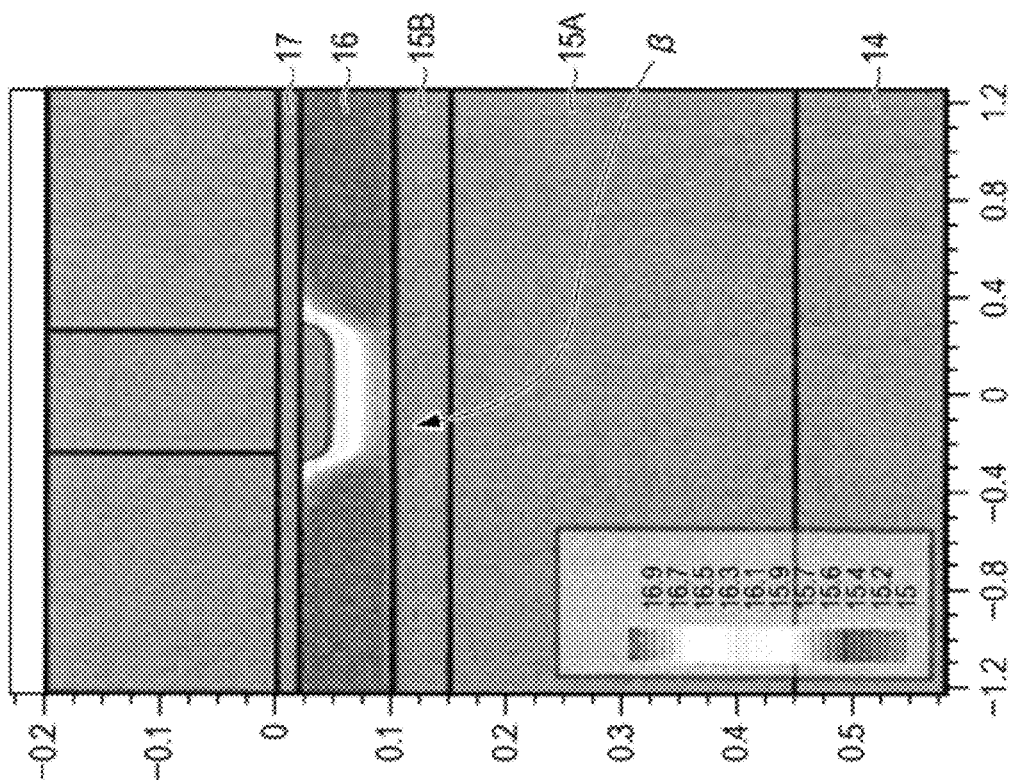

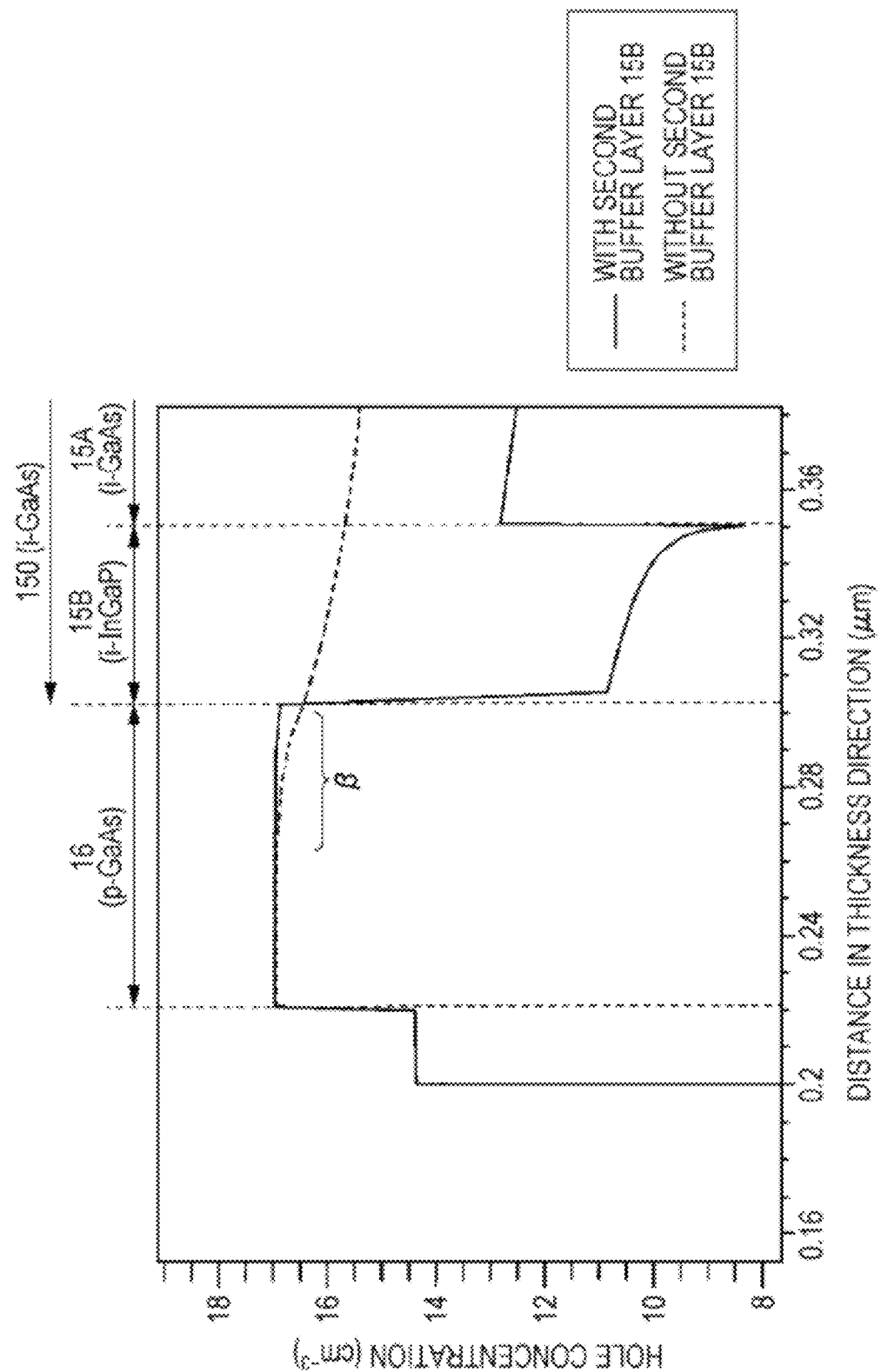

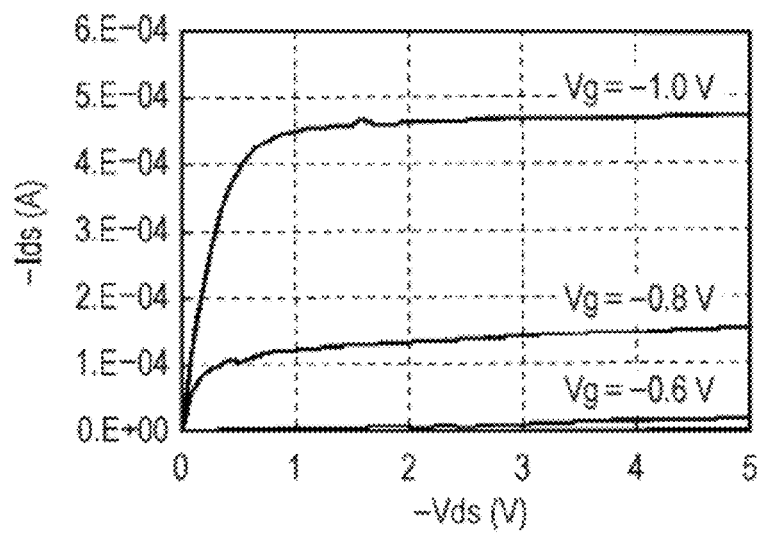
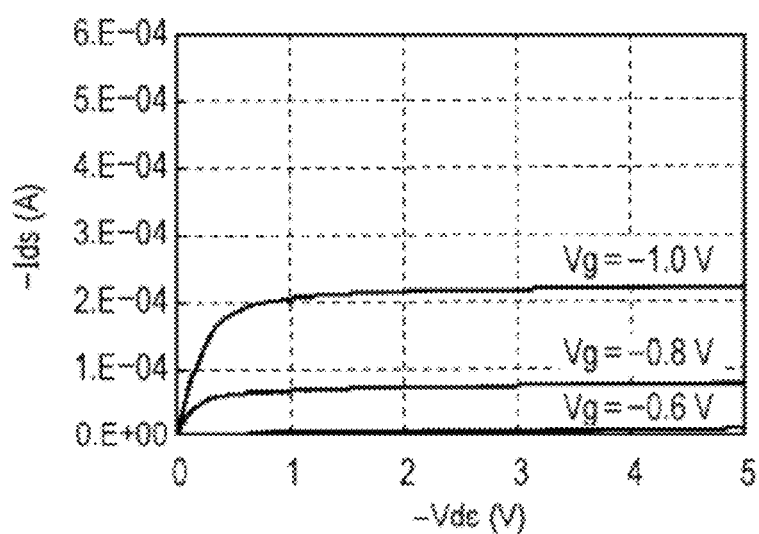

SEMICONDUCTOR DEVICE

BACKGROUND

The present disclosure relates generally to semiconductor devices, and more particularly, to semiconductor devices including field-effect transistors of compound semiconductor series.

Field-effect transistors including compound semiconductor layers of GaAs series and so forth have high electron mobility and desirable frequency characteristics, and have been widely used for this reason in the area of high frequency range device applications such as cellular phones and others. In use presently in the range of the high frequency bands, high electron mobility transistors (HEMTs) are adapted as n-channel FETs (field-effect transistors). Among others, pseudomorphic high electron mobility transistors (pseudomorphic HEMTs or PHEMTs) have also been used for realizing even higher electron mobility after tolerating certain degrees of lattice mismatch in the epitaxial growth. In addition, JPHEMT (junction pseudomorphic HEMT) is also used incorporating a p-n junction formed in its gate region (see Japanese Unexamined Patent Application Publication No. 11-150264, for example).

With the recent trend towards higher performance of n-channel FETs, there is also increasing demand for higher integration, which asks for the development of complementary device elements using compound semiconductors.

SUMMARY

As a method of forming an n-channel FET and a p-channel FET simultaneously on a compound semiconductor substrate, it is contemplated first to carry out an epitaxial growth for forming n-channel FET, subsequently another epitaxial growth for forming p-channel FET, and selective etching thereafter, for example. When the p-channel FET is formed in this method, however, the mobility of holes, as the majority carrier, is obtained considerably lower than that of electrons as the majority carrier of the n-channel FET. Therefore, this presents a problem that on-resistance is very high when the enhancement type FET is formed.

In order to reduce the on-resistance, it is effective to increase the thickness of the channel and also increase the concentration of careers. With these measures, however, the shift of threshold voltage takes place; this presents another problem of increasing difficulties in manufacturing the enhancement type FET.

The present disclosure addresses the foregoing and other problems associated with previous methods and devices. It would be desirable, therefore, to provide semiconductor devices capable of reducing the on-resistance of p-channel FET formed on the compound semiconductor.

According to an embodiment of the present disclosure, a semiconductor device is provided including a p-channel field-effect transistor region formed above a compound semiconductor substrate. The p-channel field-effect transistor region includes an undoped buffer layer; a p-type channel layer formed in contact with the buffer layer; a p-type source region and a p-type drain region formed in the channel layer, being separated with each other; and an n-type gate region formed above the channel layer and between the source region and the drain region. The buffer layer is formed having either a multilayer structure including a hole diffusion control layer with a band gap larger than the channel layer, or a single layer structure including only the hole diffusion control layer.

It is meant by "undoped" that impurities are not added intentionally during the crystal growth.

In the p-channel field-effect transistor region in the semiconductor device according to this disclosure, the buffer layer, which is formed in contact with the lower face of the channel layer, has either the multilayer structure including the hole diffusion control layer with its band gap larger than the channel layer, or the single layer structure including only the hole diffusion control layer. As a result, a discontinuity (band offset) of valence band energy arises at the hetero-junction interface between the second buffer layer and the channel layer, and the diffusion of holes, as the majority carriers for the p-channel FET into the buffer layer, can be controlled.

In the semiconductor device of the present disclosure, an n-channel field-effect transistor region may further be provided above the compound semiconductor substrate in the region different from the p-channel field-effect transistor region. In this case, the n-channel field-effect transistor region may include a HEMT which is formed including, for example, an undoped electron transit layer, and an n-type barrier layer which has an ohmic contact with the electron transit layer and is capable of supplying n-type charges to the electron transit layer. Furthermore, the n-channel field-effect transistor region may include, for example, a p-type gate region formed in the barrier layer, and a source electrode and a drain electrode formed in contact with the barrier layer.

As mentioned herein above, when there formed on the compound semiconductor substrate are not only the p-channel field-effect transistor region but also n-channel field-effect transistor region, the buffer layer, channel layer, and n-type gate region may be formed either above the electron transit layer and the barrier layer, or alternatively between the electron transit layer and the compound semiconductor substrate. In this case where the buffer layer, channel layer, and n-type gate region are formed above the electron transit layer and the barrier layer, and where the barrier layer is formed including only the hole diffusion control layer, it is preferable for the barrier layer be formed in contact with the buffer layer.

With the semiconductor device according to the present disclosure, since the diffusion of the holes into the buffer layer is made to be appropriately controlled, the on-resistance of p-channel FETs can be reduced. As a result, since several measures become unnecessary, which are otherwise necessary for reducing the on-resistance of the p-channel FET such as increasing the thickness of the channel and increasing the concentration of careers, and so forth, it becomes feasible to manufacture the enhancement type FETs more easily.

In addition, with the semiconductor device of the present disclosure, when not only p-channel field-effect transistor region but also n-channel field-effect transistor region are provided on a compound semiconductor substrate and a buffer layer is formed between a channel layer and an electron transit layer, avalanche breakdown through the electron transit layer hardly arises because of the band offset formed at the hetero-junction interface between the buffer layer and the channel layer. As a result, since the breakdown voltage of the p-channel FET is increased without increasing the thickness of undoped GaAs layer and so forth, difficulties in manufacturing due to the level difference between p-channel FET and n-channel FET (such as the coverage problems during photoresist coating and the deterioration in exposure margin, for example) can be suppressed to the minimum.

Still in addition, in the semiconductor device of the present disclosure; when a buffer layer is formed having a single layer structure including either InGaP or InGaAsP; a barrier layer is formed with GaAs or AlGaAs; the buffer layer, channel layer, and gate layer are formed above an electron transit layer and the barrier layer; and the barrier layer is formed in contact with the buffer layer; it becomes feasible for the buffer layer be utilized as an etch stop layer for the reason of high selection ratio against etchants (hydrochloric acid, for example). Specifically, by carrying out first the epitaxial growth for forming n-channel FET, another epitaxial growth for forming p-channel FET subsequently, and selective etching thereafter, it becomes possible to utilize the buffer layer as an etch stop layer in forming the n-channel FET and p-channel FET simultaneously on one single substrate. Therefore, the control of over-etching of the barrier layer becomes feasible and the dispersion in characteristics of n-channel FETs can be reduced, as a result.

BRIEF DESCRIPTION OF THE DRAWINGS

FIG. 3 includes a table showing the combination of materials for forming the channel layer and the buffer layer according to an embodiment of the present disclosure;

FIG. 6A shows simulation results on the distribution of hole concentration for the case where the buffer layer is provided;

FIG. 6B shows the simulation results on the distribution of hole concentration for the case without the buffer layer corresponding to the structure of the comparative example;

FIG. 7 shows graphical plots for illustrating the simulation results of FIG. 6A additionally including the results of FIG. 6B;

FIG. 8A shows graphical plots illustrating the $V_{ds}$ versus $I_{ds}$ characteristics of the p-channel FET for the case where the buffer layer is provided;

FIG. 8B shows graphical plots illustrating the $V_{ds}$ versus $I_{ds}$ characteristics of the p-channel FET for the case without the buffer layer corresponding to the structure of the comparative example;

DETAILED DESCRIPTION OF EMBODIMENTS

Figure 1:
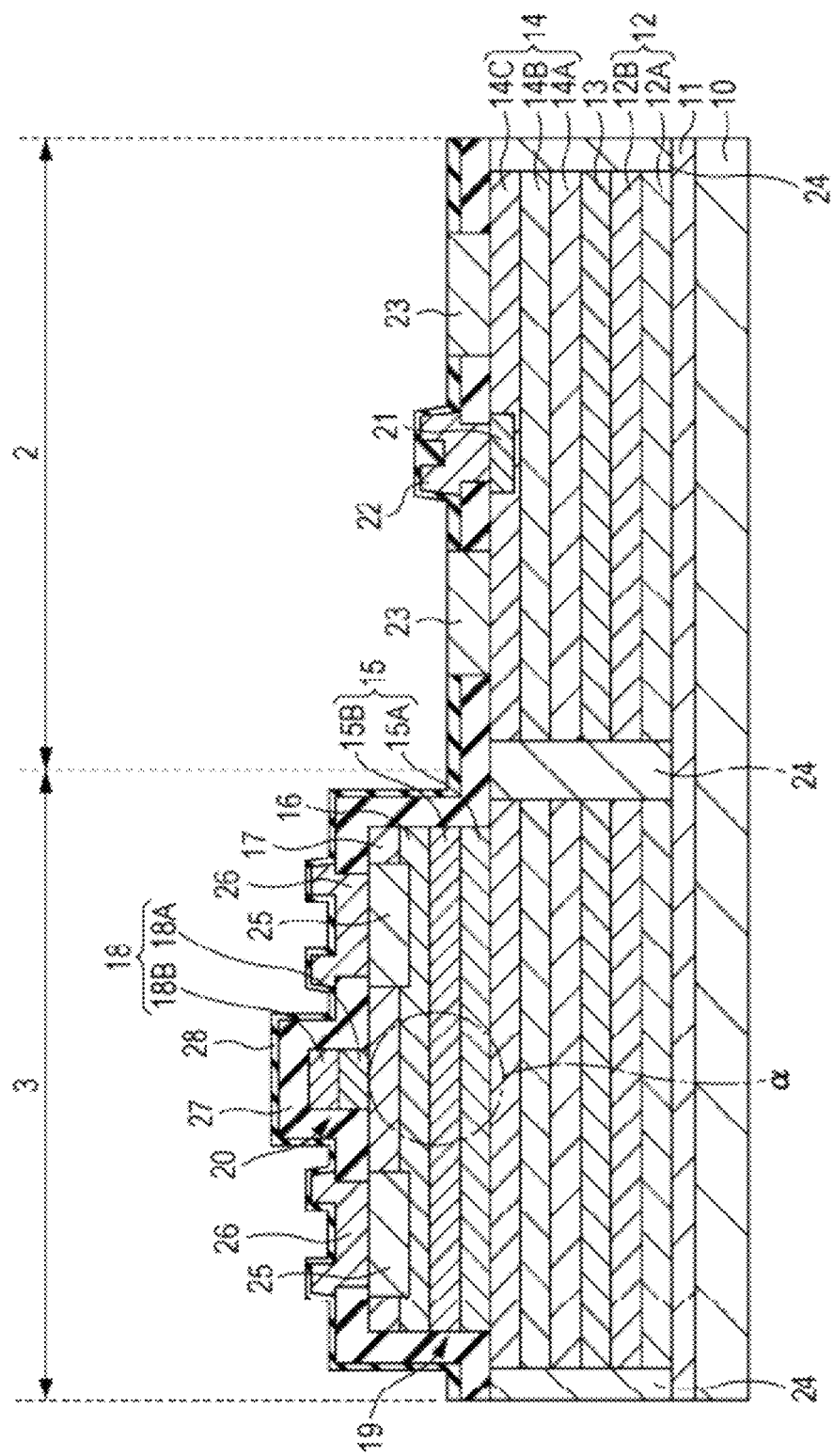
FIG. 1 is a cross-sectional view illustrating an example of a semiconductor device according to an embodiment of the present disclosure.

Referring now to the drawings, preferable embodiments of the present disclosure is detailed hereinbelow.

The description will be made in the following order.
1. Embodiments (FIGS. 1 through 16)
  Examples of epitaxially grown layers for forming p-channel FET, the epitaxially grown layers being formed on epitaxially grown layers for forming n-channel FET.
2. Modifications (FIGS. 17 and 18)
  Examples of epitaxially grown layers for forming n-channel FET, the epitaxially grown layers being formed on epitaxially grown layers for forming p-channel FET.

1. Embodiments (Construction)

FIG. 1 is a cross-sectional view illustrating an example of a semiconductor device 1 according to an embodiment of the present disclosure. The semiconductor device 1 is formed including field-effect transistors with the materials of compound semiconductor series, and specifically illustrated by the structure shown in FIG. 1, provided with a first region with an n-channel FET formed thereon (hereinafter referred to as "n-channel FET region 2") and a second region with a p-channel FET formed thereon (hereinafter referred to as "p-channel FET region 3"), both regions being formed on one single substrate 10. In the present embodiment, the substrate 10 is a GaAs substrate.

The n-channel FET region 2 and the p-channel FET region 3 are both provided with epitaxially grown layers for forming n-channel FETs. Referring to FIG. 1, for example, the epitaxially grown layers are provided with a buffer layer 11, first barrier layer 12, electron transit layer 13, and second barrier layer 14, sequentially accumulated in that order from the side of the substrate 10. The first barrier layer 12 may be omitted where appropriate.

The buffer layer 11 is a p-type AlGaAs layer, for example. The buffer layer 11 may alternatively be an undoped GaAs layer. The barrier layer 12 is formed by accumulating an electron supply layer 12A and a high resistance layer 12B sequentially from the side of the substrate 10. The electron supply layer 12A is used for supplying electrons to the electron transit layer 13, which is formed as an n-type AlGaAs layer, for example. The electron supply layer 12A is doped with Si as n-type impurities to a high concentration (ranging from $1 \times 10^{12}$ to $4 \times 10^{12}$ atoms/cm$^{-3}$). The thickness of the electron supply layer 12A is 3 nm, for example. The high resistance layer 12B is formed for providing a satisfactory hetero-junction interface on the boundary of the electron transit layer 13 on the side of the substrate 10, which is formed as an undoped AlGaAs layer, for example. The thickness of the high resistance layer 12B is 3 nm, for example.

The electron transit layer 13 is an undoped InGaAs layer, for example. The thickness of the electron transit layer 13 is in the range from 5 to 15 nm. The barrier layer 14 is formed by accumulating a high resistance layer 14A, an electron supply layer 14B, and another high resistance layer 14C, sequentially from the side of the substrate 10. The high resistance layer 14A is formed for providing a satisfactory hetero-junction interface on the boundary on the upper side of the electron transit layer 13, which is formed as an undoped AlGaAs layer. The thickness of the high resistance layer 14A is 3 nm, for example. The electron supply layer 14B is used for supplying electrons to the electron transit layer 13, which is formed as an n-type AlGaAs layer, for example. The electron supply layer 14B is doped with Si as n-type impurities to a high concentration (ranging from $1\times10^{12}$ to $4\times10^{12}$ atoms/cm$^{-3}$). The thickness of the electron supply layer 14B is 6 nm, for example. The high resistance layer 14C is formed as an n-type AlGaAs layer, for example. The electron supply layer 14C is doped with Si as n-type impurities to a low concentration (ranging from $1\times10^{10}$ to $4\times10^{11}$ atoms/cm$^{-3}$). The thickness of the high resistance layer 14C is in the range from 70 to 200 nm.

The n-channel FET region 2 is further provided with a gate region 21, a gate electrode 22, and two source and drain electrodes 23, as shown in FIG. 1, for example. One of the two electrodes 23 serves as a source electrode, while the other of the two electrodes 23 serves as a drain electrode.

The gate region 21 is formed being buried in the upper face of the high resistance layer 14C, which is formed as a p-type region by diffusing Zn into the n-type AlGaAs layer of the high resistance layer 14C. The gate electrode 22 is formed in contact with the upper face of the gate region 21. The gate electrode 22 is a metal electrode formed by successively accumulating titanium (Ti), platinum (Pt), and gold (Au), which provides an ohmic contact with the gate region 21. These two source and drain electrodes 23 are arranged to be separated with each other and placing the gate electrode 22 in between. In addition, the source and drain electrodes 23 are respectively formed to be in contact with two regions, which are opposing to each other with the gate domain 21 intervened in between among the portions on the upper face of the high resistance layer 14C. The source and drain electrodes 23 are metal electrodes formed by successively depositing gold-germanium alloy (AuGe) and nickel (Ni), for example, which provides the ohmic contact with the high resistance layer 14C.

The p-channel FET region 3 is further provided with epitaxially grown layers for forming the p-channel FET on the epitaxially grown layers of the n-channels FET. As shown in FIG. 1, the epitaxially grown layers for forming the p-channel FET includes, for example, a buffer layer 15, channel layer 16, gate leak prevention layer 17, and gate region 18, sequentially accumulated in that order from the side of the substrate 10. The buffer layer 15, channel layer 16, and gate leak prevention layer 17 are herein formed as a mesa structure through etching process. The buffer layer 15, channel layer 16, and gate leak prevention layer 17 are formed together, as a mesa portion 19, as shown FIG. 1, for example, such that the upper face thereof has an area of the degree sufficient for enabling the formation of two source and drain electrodes 25, as will be described later. The gate region 18 is also formed as another mesa portion through etching process. For example, as shown in FIG. 1, the gate region 18 is herein formed, for the mesa portion 20 to have a size of the degree sufficient for enabling the formation of the gate region between the forthcoming two source and drain regions 25 among the upper faces of the mesa portion 19.

Figure 2:
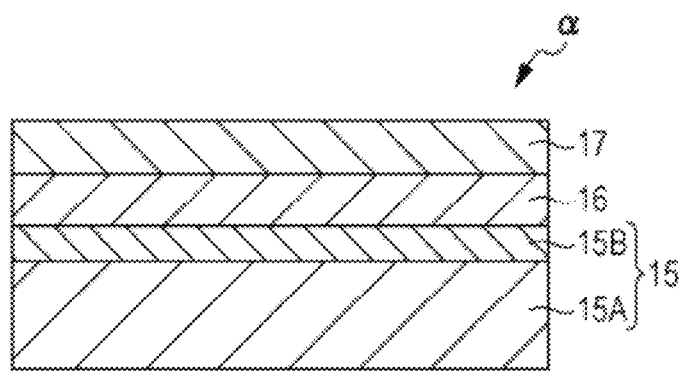
FIG. 2 is an expanded view of the portion corresponding to the region a of the semiconductor device of FIG. 1.

The buffer layer 15 is formed by accumulating a first buffer layer 15A and a second buffer layer 15B sequentially from the side of the substrate 10, for example, as shown in FIGS. 1 and 2. FIG. 2 illustrates an expanded view of the portion corresponding to the region a of the semiconductor device 1 of FIG. 1. The first buffer layer 15A is any one of undoped GaAs layer, undoped InGaAs layer, and undoped AlGaAs layer. The second buffer layer 15B is any one of undoped InGaP layer, undoped AlGaAs layer, and undoped GaAs layer. The thickness of the buffer layer 15 as a whole is in the range of 10 to 100 nm. The channel layer 16 is any one of p-type GaAs layer, p-type InGaAs layer, and p-type AlGaAs layer. The channel layer 16 is doped with C (carbon) and so forth as p-type impurities to a high concentration (ranging from $1\times10^{16}$ to $5\times10^{18}$ atoms/cm$^{-3}$). The thickness of the channel layer 16 is in the range from 30 to 250 nm. The detailed description on the combination of materials will be given later for each of the first buffer layer 15A, second buffer layer 15B, and channel layer 16.

The gate leak prevention layer 17 is an undoped AlGaAs layer, for example. The thickness of the gate leak prevention layer 17 is 50 nm or less. In addition, the gate leak prevention layer 17 may be omitted where appropriate. The gate region 18 is formed, as shown in FIG. 1, by accumulating a first gate layer 18A and a second gate layer 18B sequentially from the side of the substrate 10. The first gate layer 18A is an n-type InGaP layer, for example. The first gate layer 18A is doped with Si and so forth as n-type impurities to a high concentration (ranging from $1\times10^{17}$ to $5\times10^{19}$ atoms/cm$^{-3}$). The thickness of the first gate layer 18A is in the range from 10 to 50 nm. The second gate layer 18B is an n-type GaAs layer, for example. The second gate layer 18B is doped with Si and so forth as n-type impurities to a high concentration (ranging from $1\times10^{17}$ to $5\times10^{19}$ atoms/cm$^{-3}$). The thickness of the second gate layer 18B is in the range from 50 to 200 nm.

The p-channel FET region 3 is further provided with two source and drain regions 25 and with two source and drain electrodes 26 on the upper face of the epitaxially grown layers of the p-channels FET. These two source and drain regions 25 are formed being buried in the upper face of the mesa portion 19, which are formed as p-type regions by diffusing Zn into the gate leak prevention layer 17 and a portion of the channel layer 16, for example. As shown in FIG. 1, the source and drain regions 25 are formed to have the depth to the extent of penetrating the gate leak prevention layer 17 and reaching the channel layer 16. The two source and drain electrodes 26 are arranged to be separated with each other and placing the gate electrode 18 in between. The two source and drain electrodes 26 are respectively formed to be in contact with two regions (namely, source and drain regions 25), which are opposing to each other with the gate electrode 18 intervened in between among the portions on the upper face of the mesa portion 19. The two source and drain electrodes 26 are metal electrodes formed by successively accumulating titanium (Ti), platinum (Pt), and gold (Au), which provides ohmic contacts with the source and drain regions 25.

The n-channel FET region 2 and the p-channel FET region 3 are both provided with an insulating film 27 and a protective film 28 formed thereon, as shown in FIG. 1. The insulating film 27 is formed to cover grown layers exposed to the upper surface, and to have openings corresponding to the location for the gate region 21 and the source and drain electrodes, 23 and 26. The insulating film 27 is formed with a silicon nitride film, for example. The protective film 28 is formed to cover the entire surface of the structure including the insulating film 27, and to have openings corresponding to at least some of the portions opposing to the upper faces of the source and drain electrodes, 23 and 26, the gate electrode 21, and the gate region 18. The protective film 28 is formed with a silicon nitride film, for example. The semiconductor device 1 is further provided with device isolation regions 24 for electrically isolating the n-channel FET region 2 and the p-channel FET region 3 with one another. The device isolation regions 24 are each formed in the region between the n-channel FET region 2 and the p-channel FET region 3 to have the depth to the extent of penetrating at least the electronic transit layer 13 and the barrier layer 12. The device isolation regions 24 are formed by implanting boron (B) ions into the epitaxially grown layers of the n-channels FET, for example.

(Combination of Materials)

As described herein above, the materials for forming the first buffer layer 15A, second buffer layer 15B, and channel layer 16 are selected to be the combination as shown in FIG. 3. In this case, the second buffer layer 15B has the band gap larger than the first buffer layer 15A and the channel layer 16. That is, the second buffer layer 15B is formed with such a composition ratio as to yield its band gap larger than either the first buffer layer 15A or the channel layer 16. As a result, a discontinuity (band offset) of valence band energy arises at the hetero-junction interface between the second buffer layer 15B and the channel layer 16, and the diffusion of holes, as the majority carriers for the p-channel FET, into the buffer layer 15 is controlled. Namely, the second buffer layer 15B serves as a hole diffusion control layer.

Figure 4:
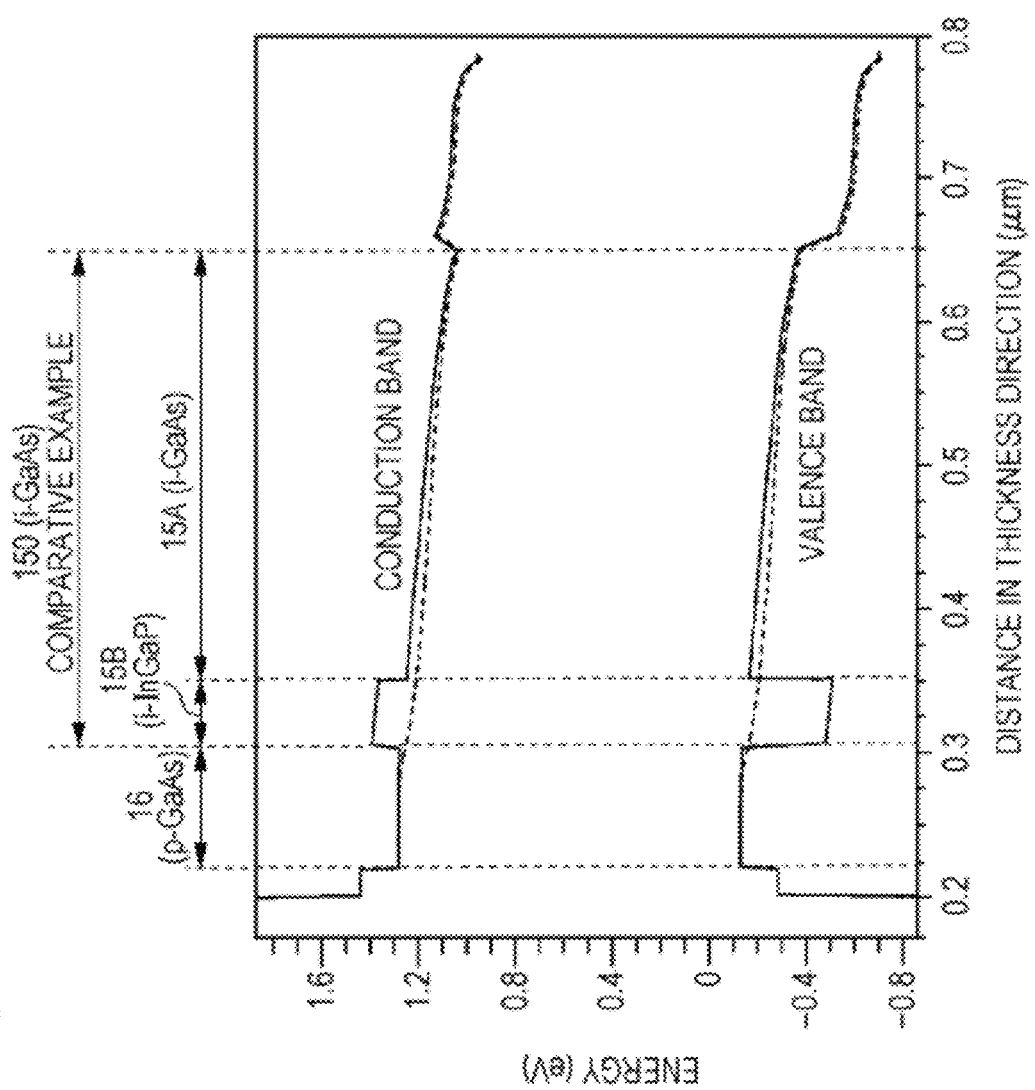
FIG. 4 shows graphical plots illustrating an example of the energy band of the channel layer and the buffer layer, additionally including the case of a comparative example.
Figure 5:
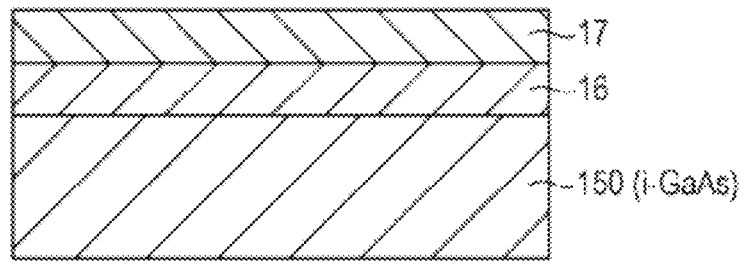
FIG. 5 is a cross-sectional view illustrating the structure of the buffer layer in the comparative example of FIG. 4.

FIG. 4 shows an example of the energy band of the first buffer layer 15A, second buffer layer 15B, and channel layer 16. The energy band of FIG. 4 illustrates the case of the first buffer layer 15A with undoped GaAs, the second buffer layer 15B with undoped InGaP, and the channel layer 16 with p-type GaAs. In addition, as a comparative example, another feature of the energy band is also included in FIG. 4 for the semiconductor device structure of FIG. 5, in which a buffer layer 150 (namely, a general buffer layer without the second buffer layer 15B) including undoped GaAs is formed under the channel layer 16.

It is found from FIG. 4 that the discontinuity (band offset) of the valence band arises at the hetero-junction interface between the second buffer layer 15B and the channel layer 16. This indicates that the second buffer layer 15B has the capability of controlling the diffusion of holes into the buffer layer 15. In the comparative example, on the other hand, it is found that such a hetero-junction interface does not exist between the buffer layer 150 and the channel layer 16, since the buffer layer 150 and the channel layer 16 are formed with the same material with each other, and the band offset does not arise. In the case of the comparative example, therefore, it is found that the buffer layer 150 does not have the capability for controlling the diffusion of holes into the buffer layer 15.

FIGS. 6A and 6B show simulation results of the distribution of hole concentration. FIG. 6A illustrates the simulation result of the case where the second buffer layer 15B is provided, while FIG. 6B illustrates the result of the case where the second buffer layer 15B is not provided (that is, corresponding to the structure of the comparative example shown in FIG. 5). FIG. 7 shows graphical plots of the hole concentration of FIGS. 6A and 6B. The notation β in FIGS. 6A, 6B, and 7 denotes the region within the channel layer 16 and in the neighborhood of, or at the interface with the second buffer layer 15B. FIGS. 6A, 6B and 7 show the results obtained at the voltage of −1V.

In the case where the second buffer layer 15B is provided, it is found from the results of FIGS. 6A and 7 that the hole concentration sharply decreases to the degree by 5 or 6 orders in magnitude at the interface between the second buffer layer 15B and the channel layer 16, and this indicates the careers are confined within the channel layer 16. In the case where the second buffer layer 15B is not provided, by contrast, it is found from the results of FIGS. 6B and 7 that the hole concentration decreases gradually in the vicinity of, or at the interface between the buffer layer 150 and the channel layer 16, and this indicates the careers are dispersed at high concentrations even into the buffer layer 150. That is, it is indicated the careers are not confined within the channel layer 16.

In addition, when the second buffer layer 15B is provided, it is also found from FIGS. 6A and 7 that the hole concentration stays almost constant within channel layer 16. By contrast, when the second buffer layer 15B is not provided, it is found from FIGS. 6B and 7 that the hole concentration in the channel layer 16 decreases as approaching to the buffer layer 150 and then decreases noticeably in the β region shown in the drawing. That is, it is found that the channel width is almost equal to the thickness of the channel layer 16 in the case where the second buffer layer 15B is provided, and that the channel width is decreased from the thickness of the channel layer 16 by the width of the β region in the case where the second buffer layer 15B is not provided.

Figure 9:
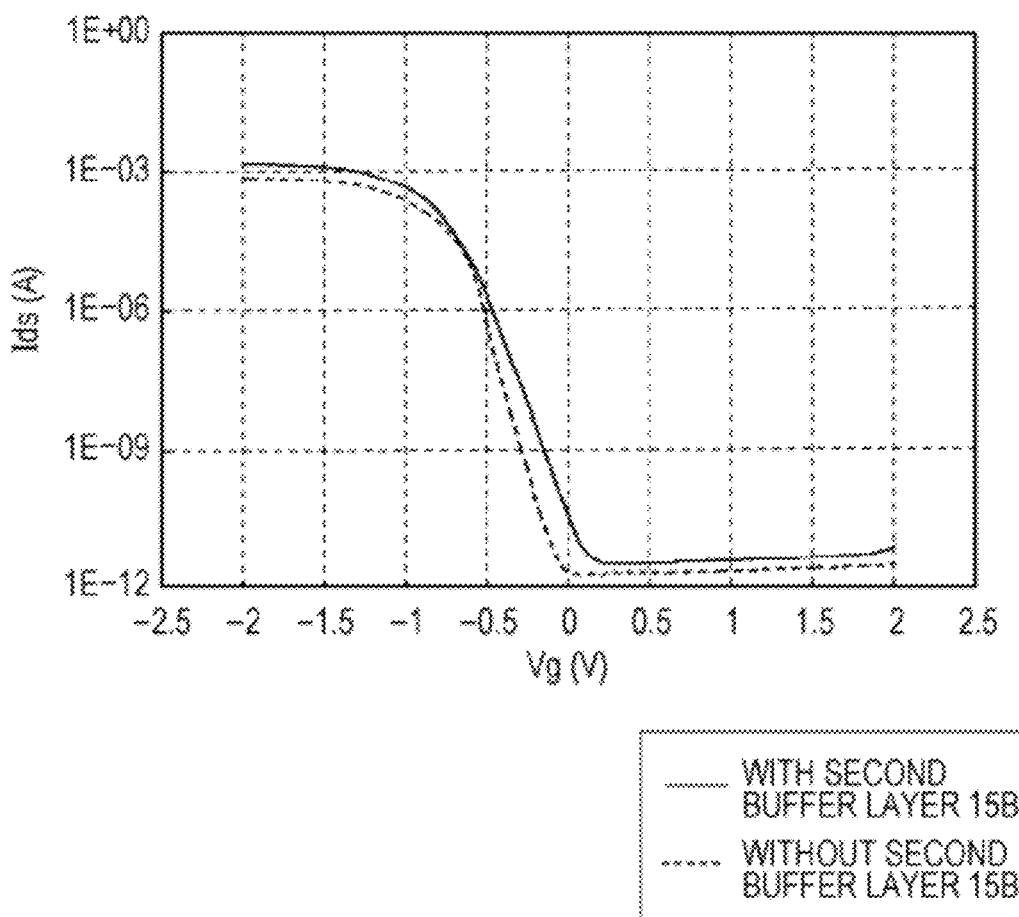
FIG. 9 shows graphical plots for illustrating the $V_g$ versus $I_{ds}$ characteristics of the p-channel FET including the case of the comparative example.

FIGS. 8A and 8B illustrate the $V_{ds}$ versus $I_{ds}$ characteristics of the p-channel FET. FIG. 8A shows the result for the case where the second buffer layer 15B is provided, while FIG. 8B is for the case where the second buffer layer 15B is not provided (that is, with the structure of FIG. 5). In FIGS. 8A and 8B, each of the top curves show the results obtained at the applied $V_g$ of −1.0 V, each of the middle curves shows the results obtained at $V_g$ of −0.8 V, and each of the bottom curves shows the results obtained at $V_g$ of −0.6 V. FIG. 9 illustrates an example of $V_g$ versus $I_{ds}$ characteristics of the p-channel FET. The solid curve line in FIG. 9 shows the result for the case where the second buffer layer 15B is provided, while the broken curve line is for the case where the second buffer layer 15B is not provided (that is, with the structure of FIG. 5).

From the results shown in FIGS. 8A, 8B, and 9, it is found the on-resistance is lower in the case where the second buffer layer 15B is provided, compared with the case where the second buffer layer 15B is not provided. The decrease in the on-resistance is considered due to the confinement of holes into the channel layer 16, caused by the second buffer layer 15B. Therefore, it is considered that the effect of the carrier confinement increases with increasing the thickness of the second buffer layer 15B, and that the on-resistance decreases, as a result.

Figure 10:
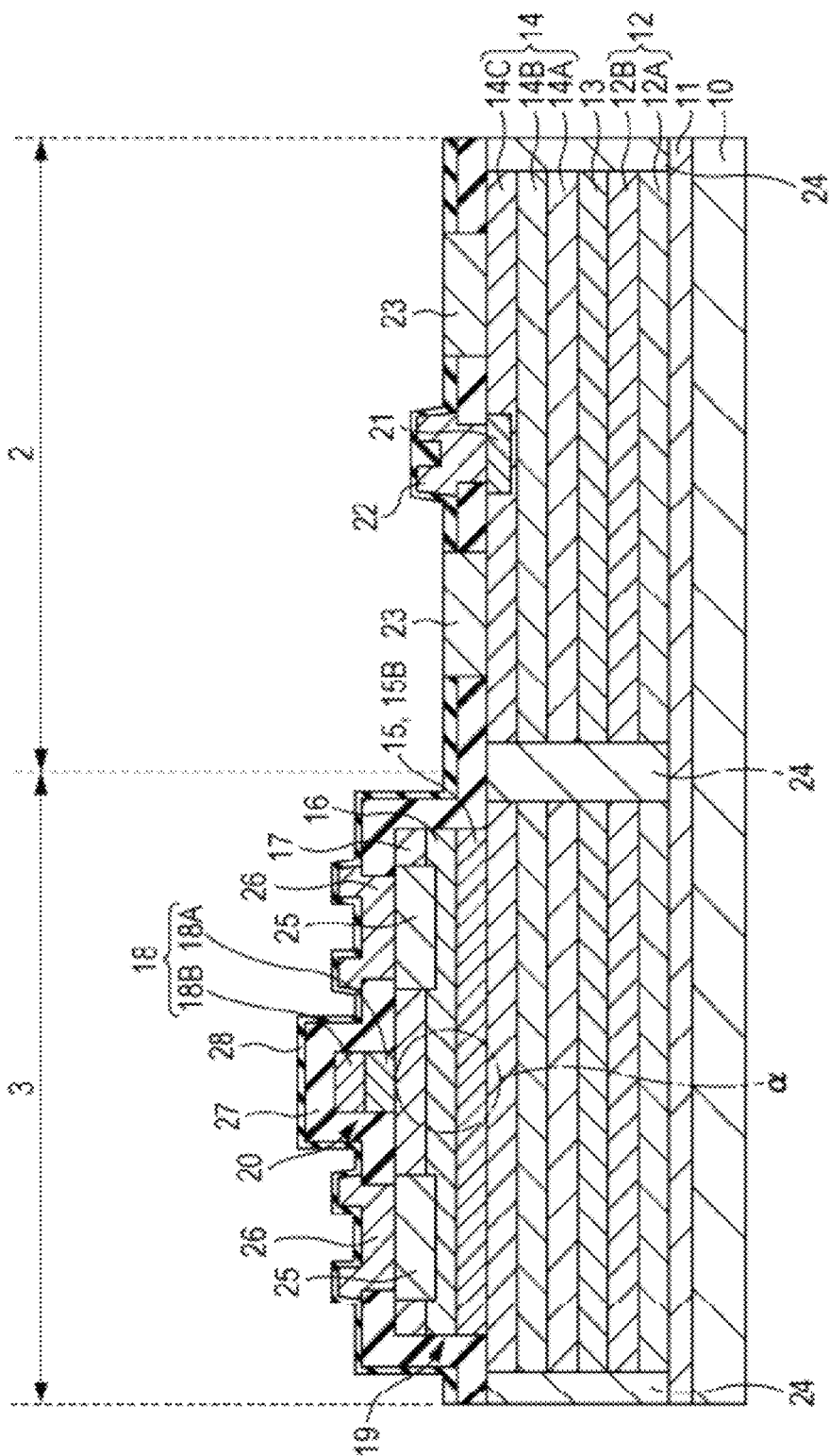
FIG. 10 is a cross-sectional view illustrating an example of a semiconductor device according to a modification to the semiconductor device of FIG. 1.

It may be noted in the semiconductor device 1 according to the present disclosure, the buffer layer 15 may alternatively be formed with only single layer like the second buffer layer 15B, as shown in FIG. 10. In this case, the buffer layer 15 is formed having the single layer structure.

(Manufacturing Method)

In the next place, an example of the method for manufacturing the semiconductor device 1 is explained according to an embodiment of the present disclosure. There explained hereinbelow is on the case where the buffer layer 15 is formed only with the second buffer layer 15B.

FIGS. 11 through 15 illustrate the method for manufacturing the semiconductor device 1 in the course of various process steps. FIGS. 11 through 15 each illustrate cross sections of the device at the process steps. In order to fabricate the semiconductor device 1, several layers primarily including either GaAs series compound semiconductors or GaP series compound semiconductors are formed on a GaAs single crystal substrate 10 by the method of MOCVD (metal organic chemical vapor deposition), for example. Utilized during the process as the materials of GaAs series compound semiconductors are trimethyl aluminum (TMA), trimethyl gallium (TMG), and arsine ($AsH_3$), for example; and as the materials of the GaP series compound semiconductors are TMI (trimethyl indium), trimethyl gallium (TMG), trimethyl phosphine (TMP), and $NH_3$ (ammonia), for example.

Figure 11:
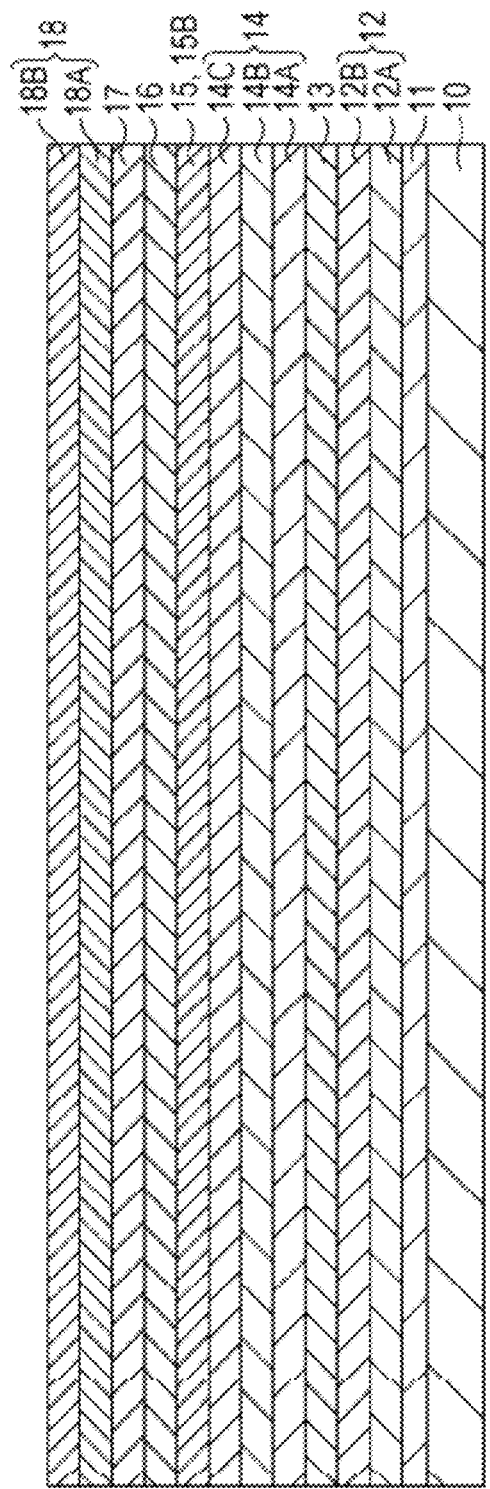
FIG. 11 is a cross-sectional view illustrating the structure for forming the semiconductor device of FIG. 10 during a formation process.

First, several layers accumulated on the substrate 10 in sequence (as shown in FIG. 11) are a buffer layer 11, barrier layer 12 (electron supply layer 12A and high resistance layer 12B), electron transit layer 13, barrier layer 14 (high resistance layer 14A, electron supply layer 14B, and high resistance layer 14C), buffer layer 15 (second buffer layer 15B), channel layer 16, gate leak prevention layer 17, and gate region 18 (first gate layer 18A and second gate layer 18B).

During the process, a p-type AlGaAs layer was formed as the buffer layer 11. As the electronic supply layer 12A, an AlGaAs layer is formed being doped with Si as n-type impurities to a high concentration (ranging from $1 \times 10^{12}$ to $4 \times 10^{12}$ atoms/cm$^{-3}$) to have a thickness of 3 nm, for example. As the high resistance layer 12B, an accumulated structure is formed with an undoped AlGaAs layer having a thickness of 3 nm. As the electron transit layer 13, another undoped InGaAs layer is formed with a thickness ranging from 5 to 15 nm. As the high resistance layer 14A, an undoped AlGaAs layer is formed with a thickness of 3 nm. As the electron supply layer 14B, an AlGaAs layer doped with Si as n-type impurities to a high concentration (ranging from $1 \times 10^{12}$ to $4 \times 10^{12}$ atoms/cm$^{-3}$) is formed to have a thickness of 6 nm. As the high resistance layer 14C, an AlGaAs layer doped with Si as n-type impurities to a low concentration (ranging from $1 \times 10^{10}$ to $4 \times 10^{11}$ atoms/cm$^{-3}$) is formed to have a thickness ranging from 70 to 200 nm. As the second buffer layer 15B, an undoped InGaP layer is formed with a thickness ranging from 10 to 100 nm. As the channel layer 16, a GaAs layer doped with C (carbon) as p-type impurities to a high concentration (ranging from $1 \times 10^{16}$ to $5 \times 10^{18}$ atoms/cm$^{-3}$) is formed to have a thickness ranging from 30 to 250 nm. As the gate leak prevention layer 17, an undoped AlGaAs layer is formed with a thickness of 50 nm or less. As the first gate layer 18A, an InGaP layer doped with Si as n-type impurities to a high concentration (ranging from $1 \times 10^{17}$ to $5 \times 10^{19}$ atoms/cm$^{-3}$) is formed to have a thickness ranging from 10 to 50 nm. As the second gate layer 18B, a GaAs layer doped with Si as n-type impurities to a high concentration (ranging from $1 \times 10^{17}$ to $5 \times 10^{19}$ atoms/cm$^{-3}$) is formed to have a thickness ranging from 50 to 200 nm.

Figure 12:
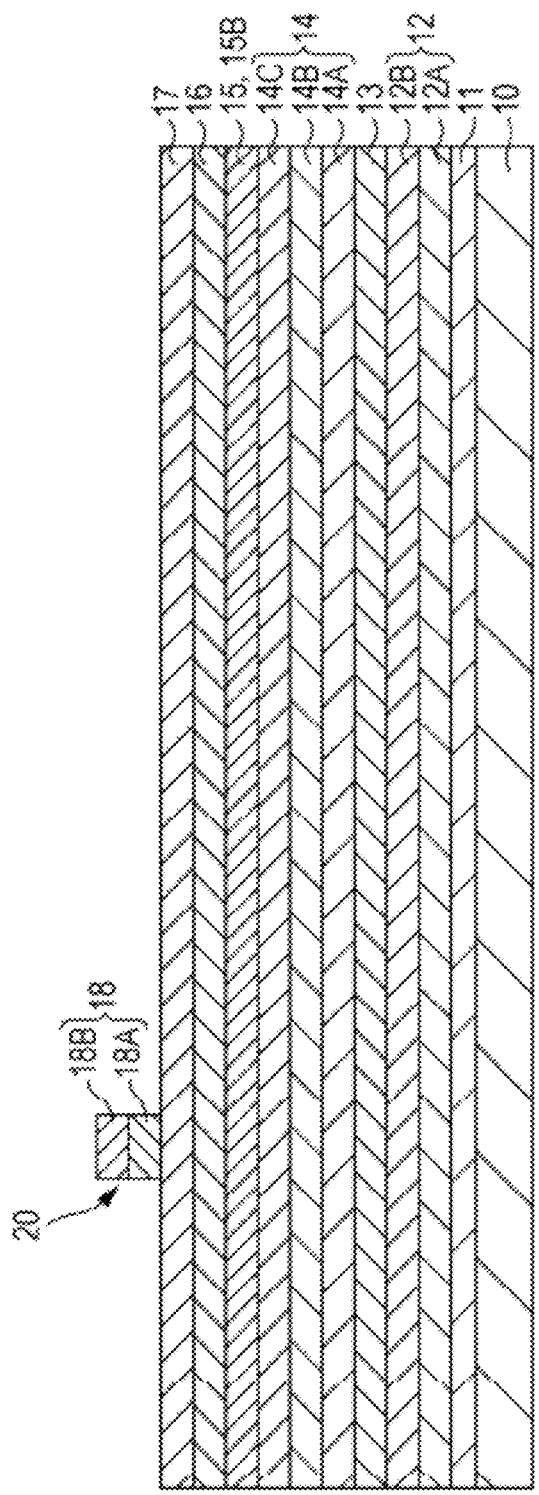
FIG. 12 is another cross-sectional view illustrating the structure subsequent to FIG. 11 during the formation process.

Thereafter, a mesa structure 20 is formed in the p-channel FET region 3 by selectively removing by etching the second gate layer 18B and the first gate layer 18A (FIG. 12). By using photolithographic technology and either wet etching or dry etching technology, for example, the mesa structure 20 is formed and the gate leak prevention layer 17 is exposed as well.

Figure 13:
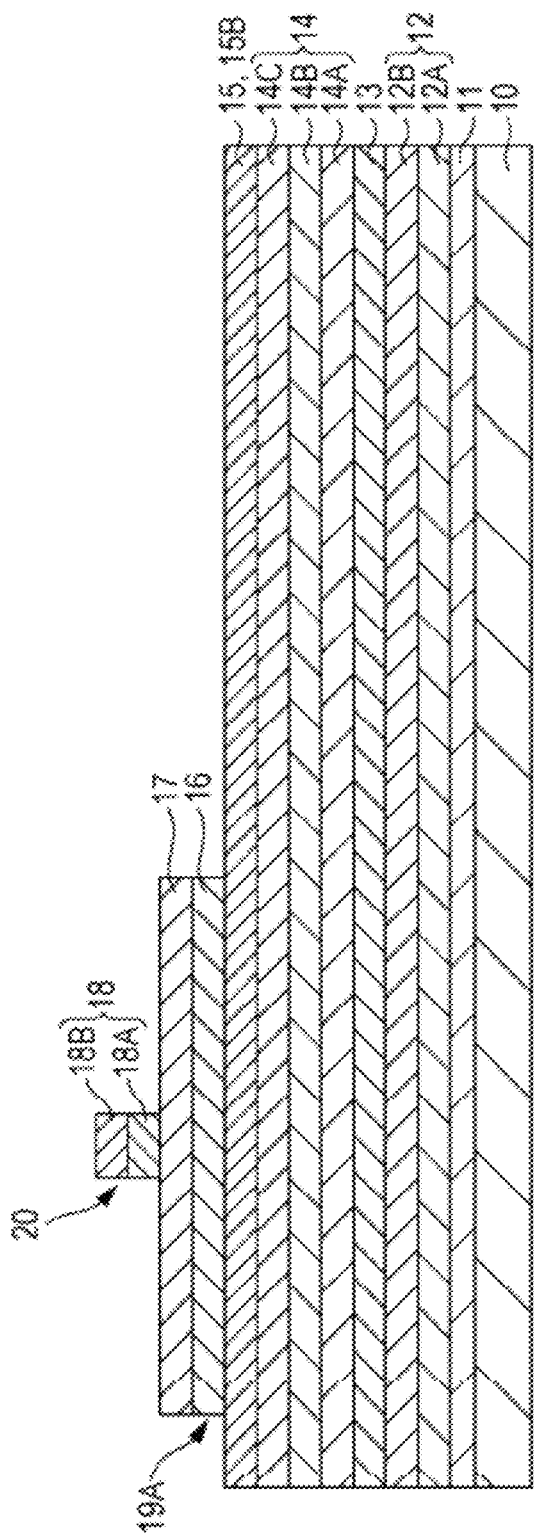
FIG. 13 is still another cross-sectional view illustrating the structure subsequent to FIG. 12 during the formation process.

Next, another mesa structure 19A is formed in the p-channel FET region 3 by selectively removing by etching the gate leak prevention layer 17 and the channel layer 16 in sequence (FIG. 13). By using photolithography and wet etching techniques, the mesa structure 19A is formed and the second buffer layer 15B is exposed. At this time, the second buffer layer 15B serves as an etch stop layer during the wet etching.

Figure 14:
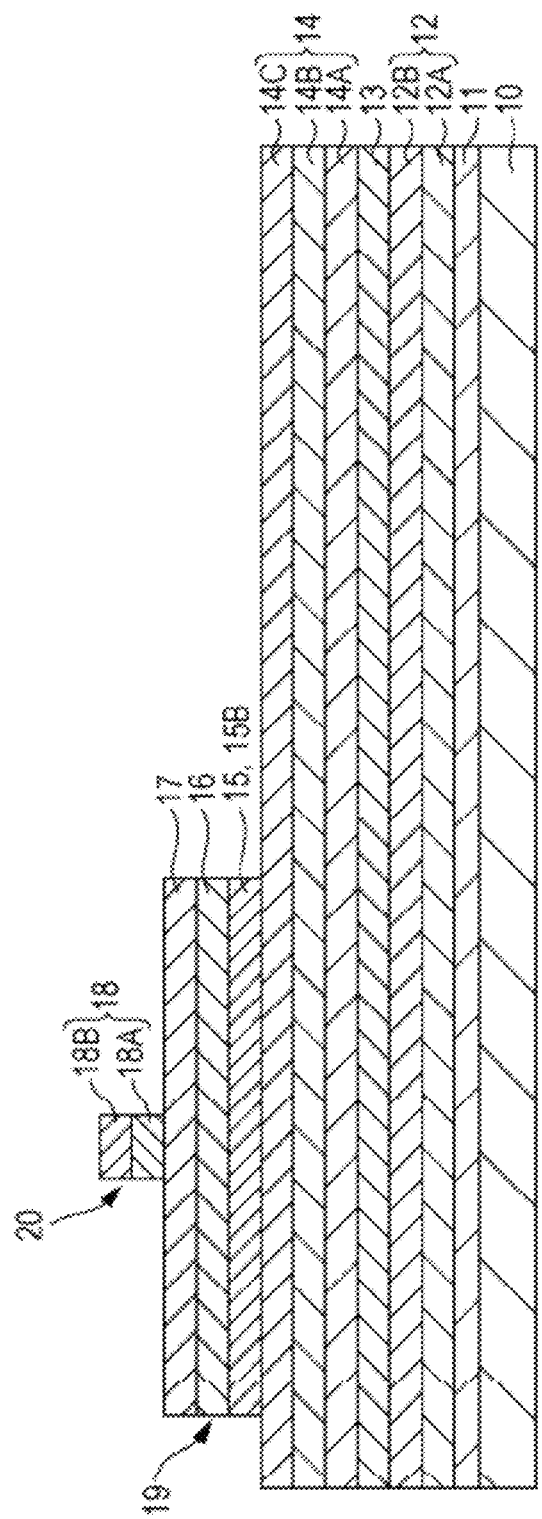
FIG. 14 is another cross-sectional view illustrating the structure subsequent to FIG. 13 during the formation process.
Figure 15:
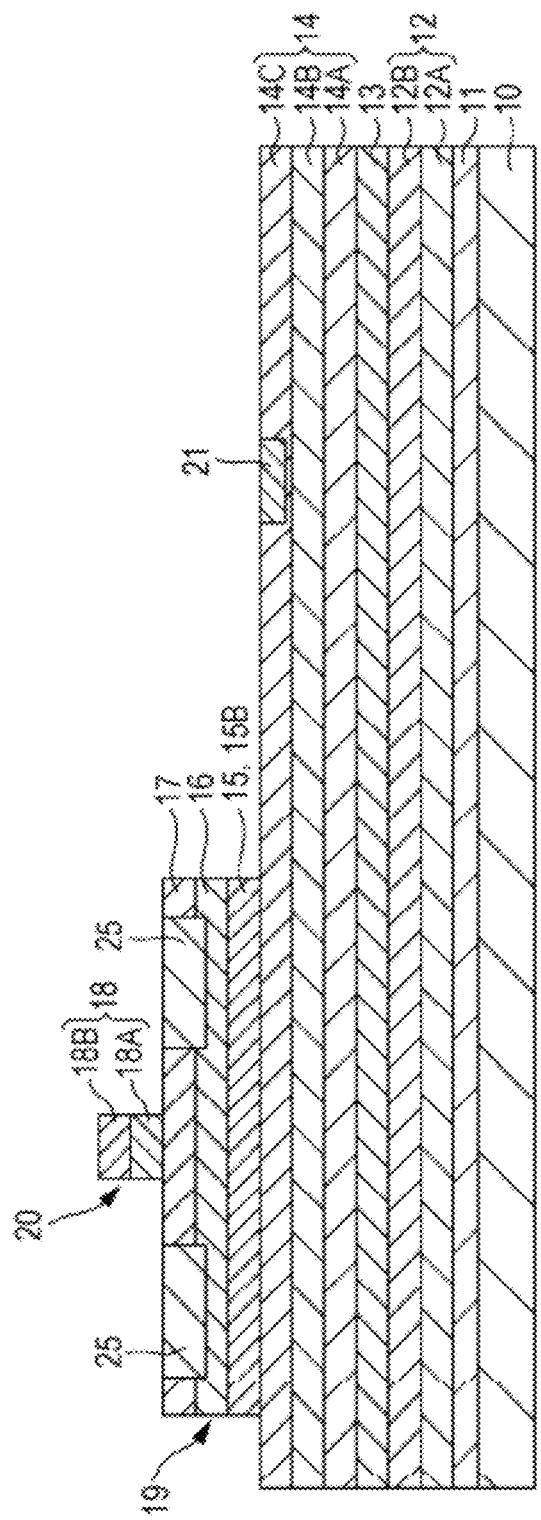
FIG. 15 is another cross-sectional view illustrating the structure subsequent to FIG. 14 during the formation process.
Figure 16:
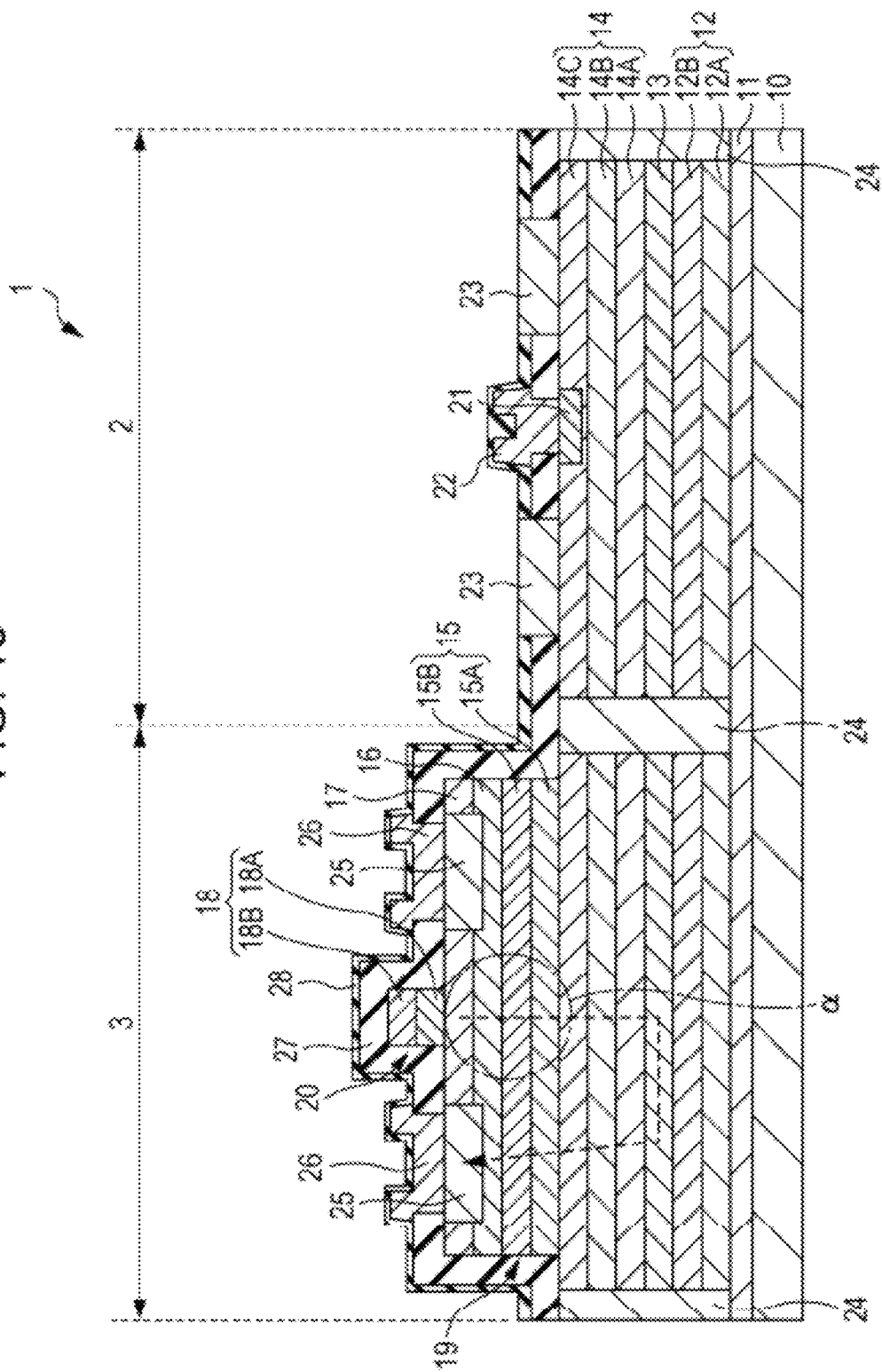
FIG. 16 is a cross-sectional view conceptually illustrating the avalanche breakdown through the electron transit layer in the device.

Subsequently, still another mesa structure 19 is formed in the p-channel FET region 3 by selectively removing by etching the second buffer layer 15B (FIG. 14). By using hydrochloric acid as an etchant of InGaP, for example, the mesa structure 19 is formed and the high resistance layer 14C is exposed as well. Since hydrochloric acid does not erode AlGaAs during the process, no damage is caused on the surface of the high resistance layer 14C.

Next, an insulating film 27 of silicon nitride layer is formed by the plasma CVD method over the entire surface of the structure to have a thickness ranging from 100 to 500 nm (not shown). In addition, the illustration thereof is omitted later on. Subsequently, the openings for forming source and drain regions 25, and forming gate regions 21 are formed in the insulating film 27. Thereafter, the substrate 10 is heated to about 600° C. in a gaseous atmosphere including diethyl zinc (Zn(C$_2$H$_5$)$_2$) and arsine (AsH$_3$), to introduce and diffuse Zn through the openings formed on the insulated film 27. Incidentally, Zn may be implanted alternatively by ion implantation in place of the diffusion process.

Subsequently, device isolation regions 24 are formed. The device isolation regions 24 are formed by ion implantation of B ions, for example. Thereafter, a metal film is deposited over the entire surface, and removed selectively using photolithography technology and etching technology, whereby the gate electrode 22 and the source and drain electrodes 26 are formed simultaneously. As a result, while providing the gate electrode 22 with an ohmic contact to the gate region 21, the source and drain electrodes 26 can also be provided with ohmic contacts with the source and drain regions 25.

Subsequently, after depositing a protective film 28 over the entire surface, the openings for forming the source and drain electrodes 23 are formed on the protective film 28 and the insulated film 27. Thereafter, source and drain electrodes 23 are formed by depositing gold germanium alloy (AuGe) to a thickness of about 160 nm and nickel (Ni) to a thickness of about 40 nm over the entire surface by resistive heating technique, and by selectively removing using photolithography technology and etching technology. As a result, the ohmic contacts between the source and drain electrodes 23, and the high resistance layer 14C can be provided. Incidentally, when the openings for forming the source and drain electrodes 23 are formed on the protective film 28 and the insulated film 27, another opening may be formed in the upper portion of the gate region 18 to form the gate electrode of p-channel FET in simultaneous with the source and drain electrodes 23.

Effect

In the p-channel FET region 3 according to the present disclosure, the buffer layer 15 is formed in contact with the lower face of the channel layer 16, the buffer layer having either the multilayer structure further including the second buffer layer 15B with the band gap larger than the channel layer 16, or the single layer structure including only the second buffer layer 15B. With this structure, the discontinuity (band offset) of the valence band arises at the hetero-junction interface between the buffer layer 15 and the channel layer 16, and the diffusion of holes, as the majority carriers for the p-channel FET, into the buffer layer 15, is suppressed. As a result, the on-resistance of p-channel FET can be reduced. Since several measures become unnecessary, which are otherwise necessary for reducing the on-resistance of p-channel FETs such as increasing the thickness of the channel and increasing the concentration of careers, and so forth, it becomes feasible to manufacture the enhancement type FETs more easily.

In addition, according to the present embodiment, the n-channel FET region 2 and the p-channel FET region 3 are both formed on the same substrate 10, and the epitaxially grown layers included in the p-channel FET are formed on the epitaxially grown layers included in the n-channel FET. With this structure, in the case where the buffer layer 15 has the single layer structure including either InGaP or InGaAsP, the barrier layer 14 is formed of GaAs or AlGaAs, and the barrier layer 14 is formed in contact with the second buffer layer 15B, it becomes possible for the second buffer layer 15B to be utilized as the etch stop layer for the reason of high selection ratio against etchants (hydrochloric acid, for example). As a result, since it becomes feasible to suppress the over-etching of the barrier layer 14, the dispersion in characteristics of n-channel FETs can be reduced.

Still in addition, according to the present embodiment, the second buffer layer 15B is formed between the channel layer 16 and the electron transit layer 13. As a result of the band offset formed at the hetero-junction interface between the second buffer layer 15B and the channel layer 16, the avalanche breakdown through the electron transit layer 13 (indicated by dashed line arrow in FIG. 16) becomes difficult to arise. The breakdown voltage of the p-channel FET can therefore be increased. As a result, since the breakdown voltage of the p-channel FET can be increased without increasing the thickness of undoped GaAs layer and so forth, manufacturing deficiencies due to the level difference between p-channel FET and n-channel FET (such as the step coverage problems during photoresist coating and the deterioration in exposure margin, for example) can be controlled to the minimum.

2. Modifications

While the present disclosure has been explained hereinabove with reference to the preferred embodiments and modified examples, the disclosure is not limited to those embodiments disclosed, and various modifications and alterations are possible.

Figure 17:
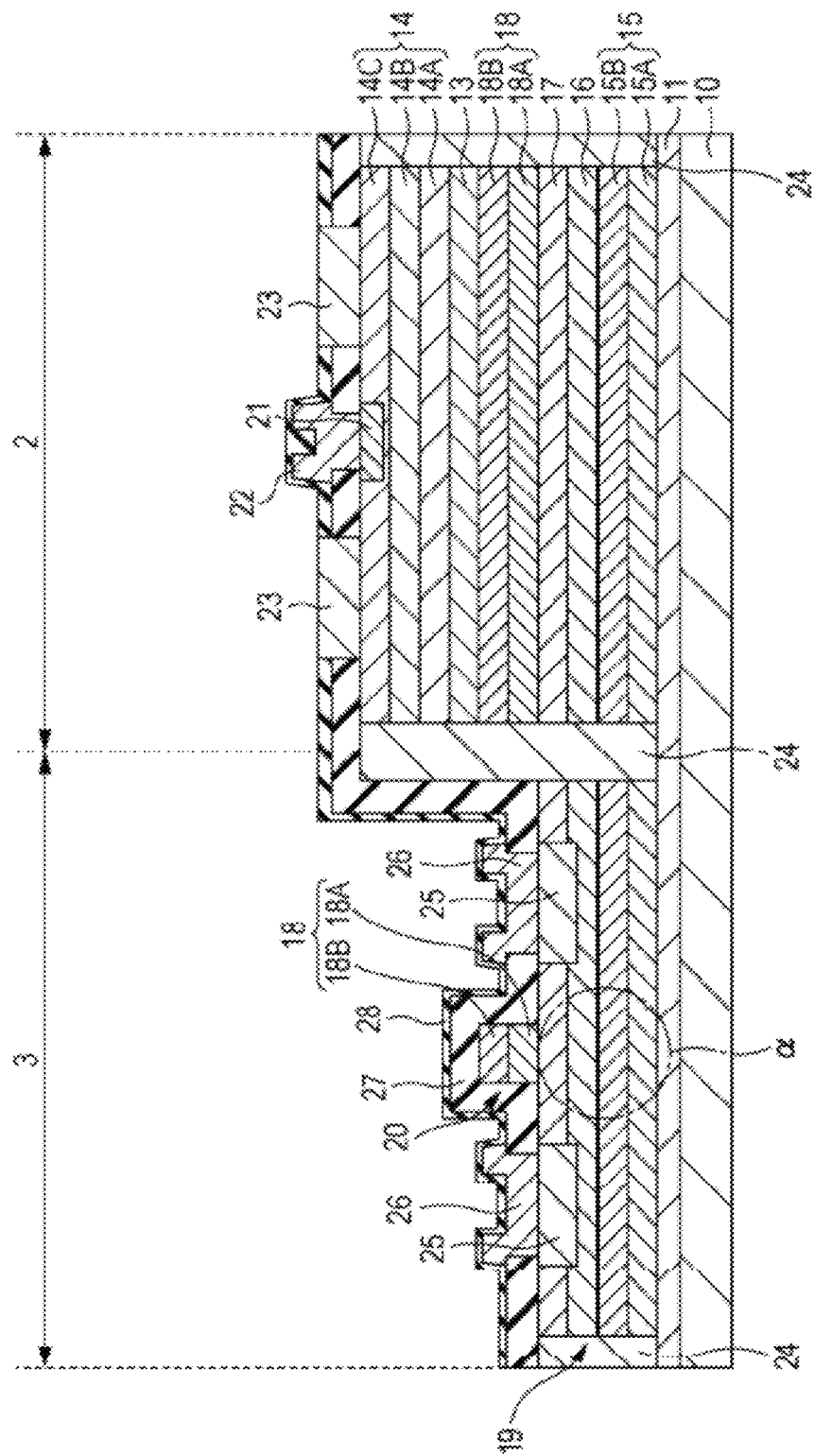
FIG. 17 is a cross-sectional view illustrating a modification to the semiconductor device of FIG. 1.
Figure 18:
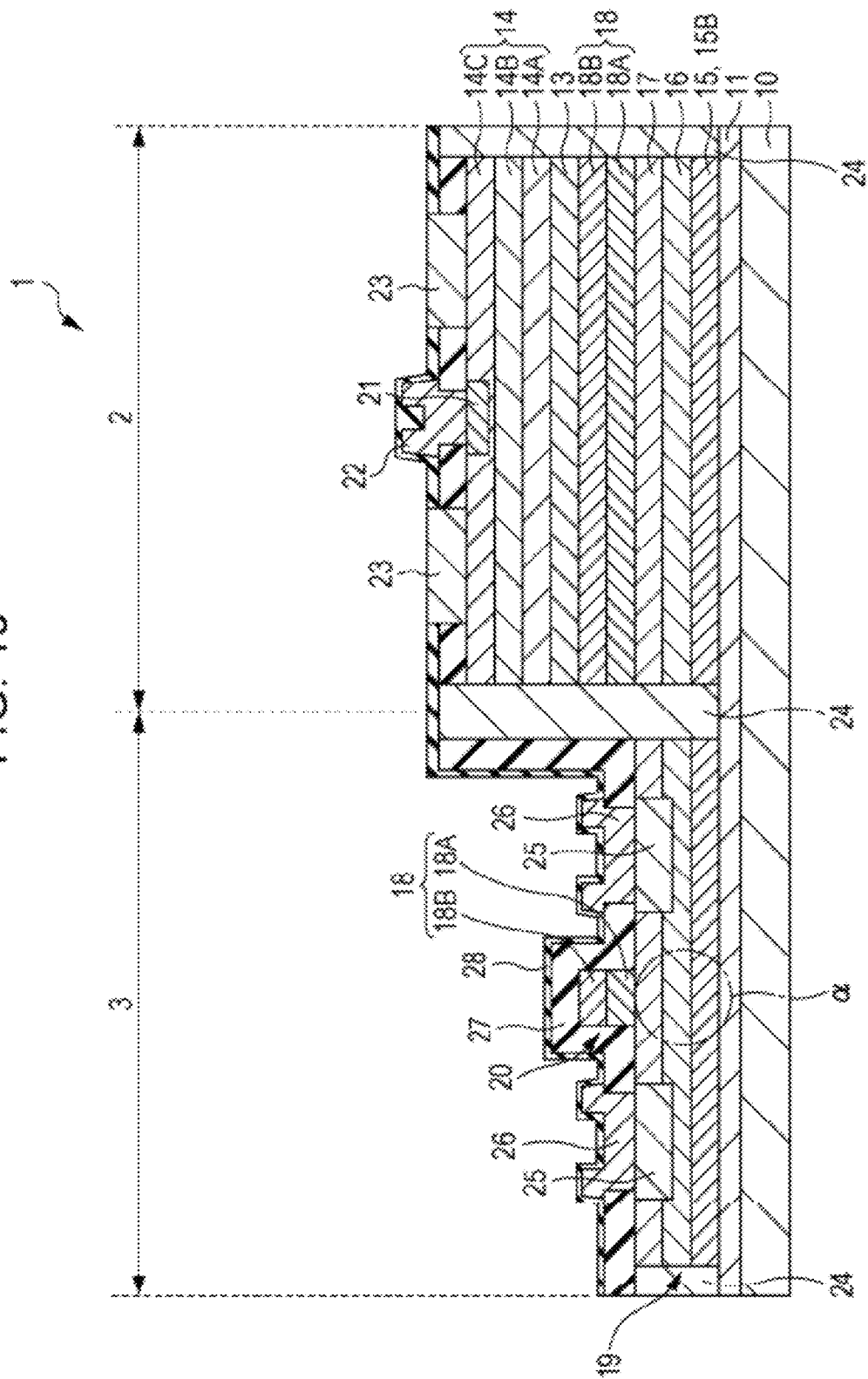
FIG. 18 is a cross-sectional view illustrating a modification to the semiconductor device of FIG. 17.

Although the epitaxially grown layers for forming p-channel FET were formed on the epitaxially grown layers for n-channel FET in the above-mentioned embodiment, on the contrary, the epitaxially grown layers for forming n-channel FET may be formed on the epitaxially grown layers for p-channel FET. For example, as shown in FIGS. 17 and 18, the buffer layer 11, second buffer layer 15, channel layer 16, gate leak prevention layer 17, gate region 18, electron transit layer 13, and barrier layer 14 may be accumulated sequentially on the substrate 10 in the order stated. Even in the case of such accumulated structure, since the diffusion of holes, as the majority carriers for the p-channel FET, into the second buffer layer 15 can be suppressed, the on-resistance of the p-channel FET can be reduced.

In addition, in the above-mentioned embodiment, a back gate electrode (not shown) may be provided in the p-channel FET region 3 to provide the ohmic contact with the barrier layer 14 (high resistance layer 14C). With such construction, on-off characteristics of the p-channel FET can be improved.

Furthermore, although the n-channel FET region 2 and the p-channel FET region 3 were formed on the substrate 10 in the above-mentioned embodiments, the n-channel FET region 2 may be omitted where appropriate.

The present disclosure contains subject matter related to that disclosed in Japanese Priority Patent Application JP 2010-242639 filed in the Japan Patent Office on Oct. 28, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device, comprising a p-channel field-effect transistor region formed above a compound semiconductor substrate, the p-channel field-effect transistor region including:
    a buffer layer, the buffer layer being undoped;
    a channel layer formed in contact with the buffer layer, the channel layer being of p-type;
    a p-type source region and a p-type drain region formed in the channel layer and, being separated from each other and having respective electrodes covered with a protective film; and
    an n-type gate region formed above the channel layer and between the p-type source and the p-type drain regions, wherein,
    the buffer layer is formed having a multilayer structure comprising a first buffer layer and a second buffer layer disposed on the first buffer layer, the second buffer layer having a band gap larger than respective band gaps of the first buffer layer and the channel layer; and
    a gate leakage prevention layer of undoped material formed between the channel layer and the n-type gate region, wherein the p-type source region and the p-type drain region are formed in the gate leakage prevention layer and in a portion of the channel layer.

2. The semiconductor device according to claim 1, wherein an n-channel field-effect transistor region is provided above the compound semiconductor substrate in a region different from the p-channel field-effect transistor region.

3. The semiconductor device according to claim 2, wherein the n-channel field-effect transistor region includes at least an electron transit layer, the electron transit layer being undoped; and an n-type barrier layer provided with an ohmic contact with the electron transit layer, being capable of supplying n-type charges to the electron transit layer.

4. The semiconductor device according to claim 3, wherein the n-channel field-effect transistor region includes a p-type gate region formed in the n-type barrier layer, and a source electrode and a drain electrode formed in contact with the n-type barrier layer.

5. The semiconductor device according to claim 4, wherein the buffer layer, the channel layer, and the n-type gate region are formed above the electron transit layer and the n-type barrier layer.

6. The semiconductor device according to claim 5, wherein the n-type barrier layer is formed in contact with the buffer layer.

7. The semiconductor device according to claim 4, wherein the buffer layer, the channel layer, and the n-type gate region are formed between the electron transit layer and the compound semiconductor substrate.

* * * * *